(12) United States Patent
Foch

(10) Patent No.: US 12,210,047 B2
(45) Date of Patent: Jan. 28, 2025

(54) DC ELECTRICAL NETWORK

(71) Applicant: Airbus Operations SAS, Toulouse (FR)

(72) Inventor: Etienne Foch, Toulouse (FR)

(73) Assignee: Airbus Operations SAS, Toulouse (FR)

( * ) Notice: Subject to any disclaimer, the term of this patent is extended or adjusted under 35 U.S.C. 154(b) by 226 days.

(21) Appl. No.: 17/725,647

(22) Filed: Apr. 21, 2022

(65) Prior Publication Data

US 2022/0341983 A1 Oct. 27, 2022

(30) Foreign Application Priority Data

Apr. 27, 2021 (FR) ..................................... 2104359

(51) Int. Cl.
| | | |
|---|---|---|
| *H02H 3/00* | (2006.01) | |
| *G01R 31/00* | (2006.01) | |
| *G01R 31/12* | (2020.01) | |
| *G01R 31/52* | (2020.01) | |
| *H02H 9/08* | (2006.01) | |
| *B60R 16/03* | (2006.01) | |
| *B64D 27/24* | (2006.01) | |

(52) U.S. Cl.
CPC ....... *G01R 31/008* (2013.01); *G01R 31/1272* (2013.01); *G01R 31/52* (2020.01); *B60R 16/03* (2013.01); *B64D 27/24* (2013.01)

(58) Field of Classification Search
CPC ... G01R 31/008; G01R 31/52; G01R 31/1272
USPC .......................................................... 361/42
See application file for complete search history.

(56) References Cited

U.S. PATENT DOCUMENTS

| | | | | |
|---|---|---|---|---|
| 6,956,728 B2 * | 10/2005 | Zhou | ...................... | H01H 9/563 |
| | | | | 361/166 |
| 2001/0029433 A1 | 10/2001 | Scott | | |
| 2004/0136125 A1 | 7/2004 | Nemir et al. | | |
| 2013/0057997 A1 | 3/2013 | Sakai et al. | | |
| 2013/0103220 A1 * | 4/2013 | Eaves | ..................... | H02H 7/261 |
| | | | | 700/293 |
| 2017/0104327 A1 * | 4/2017 | Nojima | ..................... | H02H 3/44 |

FOREIGN PATENT DOCUMENTS

EP      2360805 A1    8/2011

OTHER PUBLICATIONS

French Search Report; priority document.

* cited by examiner

*Primary Examiner* — Jared Fureman
*Assistant Examiner* — Lucy M Thomas
(74) *Attorney, Agent, or Firm* — Greer, Burns & Crain, Ltd.

(57) ABSTRACT

A DC electrical network intended to supply electricity to an electrical load via an electric power source. A first pole of the electric power source is linked to first ends of two first electrical lines, second ends of which are linked to one another, and also to a first pole of the electrical load via two stages of a contactor. A second pole of the electric power source is linked to first ends of two second electrical lines, second ends of which are linked to one another, and also to a second pole of the electrical load via two other stages of the contactor. The electrical network further comprises a processing unit configured to control the contactor to open if current measurements correspond to currents flowing in opposite directions through the two first electrical lines or through the two second electrical lines.

10 Claims, 6 Drawing Sheets

DC ELECTRICAL NETWORK

CROSS-REFERENCES TO RELATED APPLICATIONS

This application claims the benefit of the French patent application No. 2104359 filed on Apr. 27, 2021, the entire disclosures of which are incorporated herein by way of reference.

FIELD OF THE INVENTION

The invention relates to the field of protecting a DC electrical network against electric arcs, in particular in an aircraft.

BACKGROUND OF THE INVENTION

Aircraft are using ever more onboard electrical systems, which creates a need for ever higher onboard electric power. For this purpose, there is a tendency to use ever higher voltage levels, in particular with DC. Thus, some modern aircraft comprise a high-voltage direct current (HVDC) electrical network. Such an HVDC electrical network uses, for example, voltage levels of +270 V or −270 V. Now, the risk of electric arcs appearing and persisting in an electrical network is higher the higher the voltage levels are, and if this electrical network is of the DC type. Such electric arcs could cause damage to the aircraft. To avoid such damage, there is a need to detect electric arcs appearing in the electrical network as quickly as possible and to stop these electric arcs before they risk causing such damage to the aircraft.

SUMMARY OF THE INVENTION

The present invention aims, in particular, to provide a solution to this problem. It concerns a DC electrical network intended to supply electricity to an electrical load by means of an electric power source, the electrical network comprising:
  the electric power source, comprising a first pole and a second pole; and
  the electrical load, comprising a first pole and a second pole.
This DC electrical network is noteworthy in that:
  the first pole of the electric power source is linked to first ends of two first electrical lines, via at least one first stage of a first contactor;
  second ends of the two first electrical lines are linked to a first pole of a first stage of a second contactor and to a first pole of a second stage of the second contactor, respectively;
  second poles of the first stage and of the second stage of the second contactor are linked to one another, and also to the first pole of the electrical load;
  the second pole of the electric power source is linked to first ends of two second electrical lines, via at least one second stage of the first contactor;
  second ends of the two second electrical lines are linked to a first pole of a third stage of the second contactor and to a first pole of a fourth stage of the second contactor, respectively;
  second poles of the third stage and of the fourth stage of the second contactor are linked to one another, and also to the second pole of the electrical load; and
  one current sensor is associated with each of the two first electrical lines or with each of the two second electrical lines,
  and in that the electrical network further comprises a first processing unit configured to:
    acquire current measurements originating from the two current sensors associated with each of the two first electrical lines or with each of the two second electrical lines;
    determine whether the current measurements originating from the two sensors correspond to currents flowing in opposite directions through the two first electrical lines or through the two second electrical lines; and
    control the second contactor so as to open if the current measurements originating from the two sensors correspond to currents flowing in opposite directions through the two first electrical lines or through the two second electrical lines.

Thus, the electrical links between the electric power source and the electrical load are doubled by virtue of using the two first electrical lines, on the one hand, and the two second electrical lines, on the other hand. In such an electrical network, an electric arc referred to as symmetrical appearing would correspond to an electric arc appearing between one of the two first electrical lines and one of the two second electrical lines, following damage to the electrical lines under consideration. Similarly, an electric arc referred to as asymmetrical appearing would correspond to an electric arc appearing between one of the two first electrical lines and a surrounding structure or between one of the two second electrical lines and the surrounding structure, following damage to the electrical line under consideration. When the electrical network is installed on board an aircraft, the surrounding structure corresponds, for example, to a structural element of the aircraft such as a fuselage panel or frame. Simultaneous damage to the two first electrical lines or to the two second electrical lines is considered sufficiently unlikely to not be taken into consideration in the context of the invention. Thus, when an electric arc appears between one of the two first electrical lines and a surrounding structure or between one of the two second electrical lines and the surrounding structure, the other of the two first electrical lines or the two second electrical lines is considered to be undamaged. In the case of a symmetrical electric arc as well as of an asymmetrical electric arc, an electric current flows in a first direction (for example, from the electrical source to the electrical load) through the undamaged electrical line. An electric current also flows in the first direction between the first end of the damaged electrical line and the location of the damage to the electrical line (corresponding to the location of the electric arc). Given that, on the one hand, the second ends of the undamaged electrical line and of the damaged electrical line are linked to one another via the second poles of the second contactor and that, on the other hand, the electric arc corresponds to a lower impedance than the impedance of the electrical load, a current flows in the opposite direction to the first direction through the damaged electrical line, between its second end and the location of the damage to the electrical line (corresponding to the location of the electric arc). The first processing unit then detects that the currents are flowing in opposite directions through the two electrical lines and, consequently, it controls the second contactor so as to open. This has the effect of stopping the electric currents from flowing through the undamaged electrical line, and also through the portion of the damaged electrical line comprised between its second end and the location of the damage, thereby making it possible to reduce the current of the electric arc.

In one embodiment, the two current sensors correspond to second current sensors installed near the second ends of the two first electrical lines or the two second electrical lines.

Particularly, one second current sensor is associated with each of the two first electrical lines and also with each of the two second electrical lines and the first processing unit is configured to:
- acquire current measurements originating from the two second current sensors associated with each of the two first electrical lines and also current measurements originating from the two second current sensors associated with each of the two second electrical lines;
- determine whether the current measurements originating from the second current sensors correspond to currents flowing in opposite directions through the two first electrical lines and also through the two second electrical lines; and
- control the second contactor so as to open if the current measurements originating from the second current sensors correspond to currents flowing in opposite directions both through the two first electrical lines and through the two second electrical lines.

Advantageously, one first current sensor is associated with each of the two first electrical lines or with each of the two second electrical lines, the first current sensors being installed near the first ends of the two first electrical lines or the two second electrical lines, and the electrical network further comprises a second processing unit configured to:
- acquire current measurements originating from the two first current sensors associated with each of the two first electrical lines or with each of the two second electrical lines;
- calculate a difference between the current measurements originating from the two first current sensors; and
- control the first contactor so as to open if this difference is greater than a predetermined value.

Advantageously again, one first current sensor is associated with each of the two first electrical lines and also with each of the two second electrical lines and the second processing unit is configured to:
- acquire current measurements originating from the two first current sensors associated with each of the two first electrical lines and also current measurements originating from the two first current sensors associated with each of the two second electrical lines;
- calculate a first difference between the current measurements originating from the two first current sensors associated with each of the two first electrical lines and calculate a second difference between the current measurements originating from the two first current sensors associated with each of the two second electrical lines; and
- control the first contactor so as to open if the first difference and the second difference are both greater than a predetermined value.

Particularly, the second processing unit is further configured to:
- determine whether at least one of the current measurements originating from the two first current sensors associated with each of the two first electrical lines and of the current measurements originating from the two first current sensors associated with each of the two second electrical lines is above a predetermined current threshold; and
- control the first contactor so as to open if one of the measurements is above this predetermined current threshold.

Particularly again, the second processing unit is further configured to:
- determine whether there is a current differential between the first pole and the second pole of the current source, whether at least one of the current measurements originating from the first current sensors associated with one of the two first electrical lines is greater, by at least a predetermined current value, than the current measurements originating from the first current sensors associated with the two second electrical lines or whether at least one of the current measurements originating from the first current sensors associated with one of the two second electrical lines is greater, by at least the predetermined current value, than the current measurements originating from the first current sensors associated with the two first electrical lines; and
- control the first contactor so as to open if there has been determined to be a current differential.

In one particular embodiment, the second processing unit is further configured to:
- acquire a measurement of a voltage between the first pole and the second pole of the electrical source; and
- control the first contactor so as to open only if the voltage measurement is below a predetermined voltage threshold.

The invention also relates to an electrical network comprising at least one first subassembly and one second subassembly each corresponding to an electrical network like the aforementioned one, the two first electrical lines of the first subassembly being linked one by one to the two first electrical lines of the second subassembly and the two second electrical lines of the first subassembly being linked one by one to the two second electrical lines of the second subassembly.

The invention also relates to an aircraft comprising such an electrical network.

BRIEF DESCRIPTION OF THE DRAWINGS

The invention will be better understood upon reading the following description and studying the appended figures.

DETAILED DESCRIPTION OF THE PREFERRED EMBODIMENTS

Figure 2:
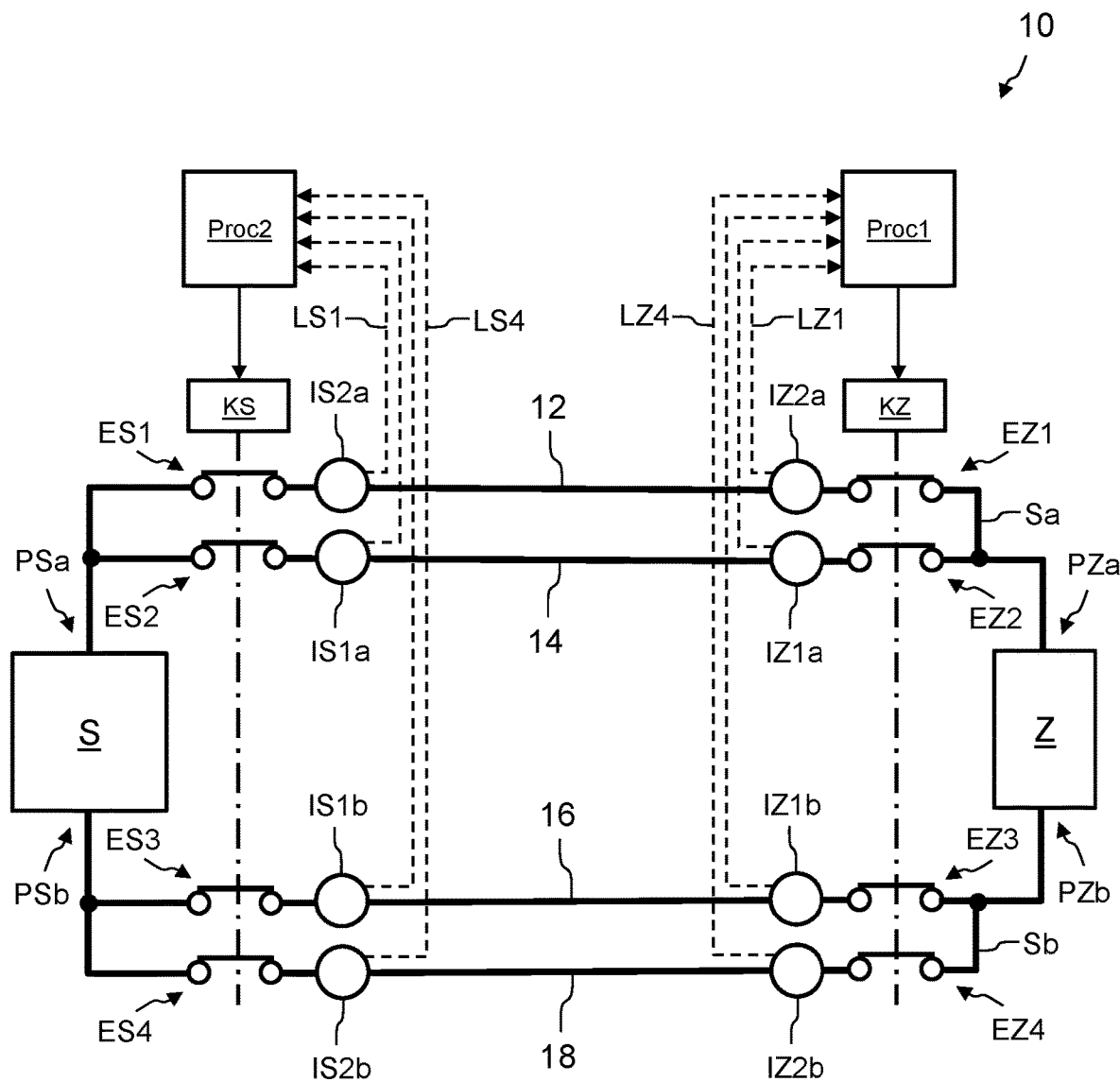
FIG. 2 schematically illustrates a DC electrical network in accordance with one embodiment of the invention.

The DC electrical network 10 shown in FIG. 2 comprises an electric power source S, and also an electrical load Z. The electric power source S comprises a first pole PSa and a second pole PSb. The electrical load Z comprises a first pole PZa and a second pole PZb. The electrical network also comprises a first contactor KS and a second contactor KZ. The first pole PSa of the electric power source S is linked to first ends of two first electrical lines 12 and 14, via two first stages ES1, ES2 of the first contactor KS. Second ends of the two first electrical lines 12 and 14 are linked to a first pole of a first stage EZ1 of the second contactor KZ and to a first pole of a second stage EZ2 of the second contactor, respectively. Second poles of the first stage EZ1 and of the second stage EZ2 of the second contactor KZ are linked to one another by means of a link Sa, and also to the first pole PZa of the electrical load Z. The second pole PSb of the electric power source S is linked to first ends of two second electrical lines 16 and 18 via two second stages ES3, ES4 of the first contactor KS. Second ends of the two second electrical lines 16 and 18 are linked to a first pole of a third stage EZ3 of the second contactor KZ and to a first pole of a fourth stage EZ4 of the second contactor, respectively. Second poles of the third stage EZ3 and of the fourth stage EZ4 of the second contactor KZ are linked to one another by means of a link Sb, and also to the second pole PZb of the electrical load Z. The electrical network also comprises one current sensor associated with each of the two first electrical lines 12, 14 or with each of the two second electrical lines 16, 18: two current sensors IZ2a, IZ1a associated with the two first electrical lines 12, 14, respectively; two current sensors IZ1b, IZ2b associated with the two second electrical lines 16, 18, respectively. These current sensors are preferably installed near the second ends of the electrical lines under consideration. The electrical network 10 further comprises a first processing unit Proc1 linked at input to the current sensors IZ2a, IZ1a, IZ1b, IZ2b by means of links LZ1 . . . LZ4, respectively. The processing unit Proc1 is configured to:
  acquire current measurements originating from the two current sensors IZ2a, IZ1a or IZ1b, IZ2b associated with each of the two first electrical lines 12, 14 or with each of the two second electrical lines 16, 18;
  determine whether the current measurements originating from the two sensors correspond to currents flowing in opposite directions through the two first electrical lines 12, 14 or through the two second electrical lines 16, 18; and
  control the second contactor KZ so as to open if the current measurements originating from the two sensors correspond to currents flowing in opposite directions through the two first electrical lines or through the two second electrical lines.

Figure 1:
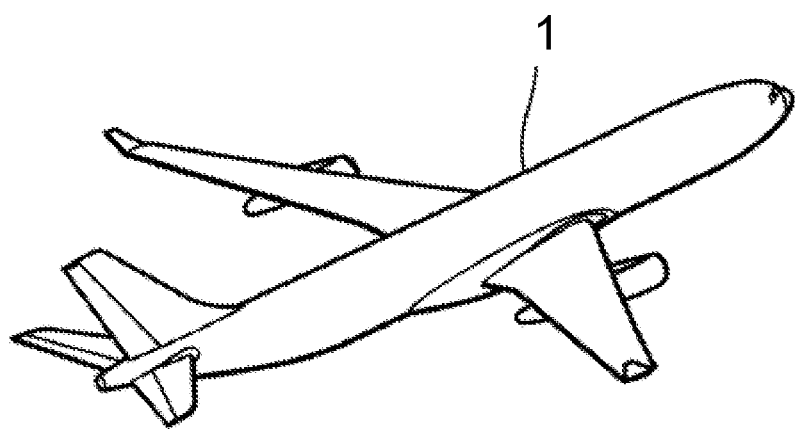
FIG. 1 shows an aircraft comprising a DC electrical network.

The DC electrical network 10 is, for example, an electrical network of an aircraft such as the aircraft 1 shown in FIG. 1.

In operation, when the various stages of the contactors KS and KZ are closed, the electrical load Z is supplied with electric power by the electric power source S. In the particular case where the first pole PSa of the electric power source corresponds to its positive pole and where the second pole PSb of the electric power source corresponds to its negative pole (or zero volts), in the absence of an electric arc in the electrical network 10, the currents through the various electrical lines are as illustrated by the various arrows in FIG. 3. In particular, the currents through the two first electrical lines flow in the same direction (illustrated by the arrows from the left to the right in the figure) and the currents through the two second electrical lines also flow in the same direction (illustrated by the arrows from the right to the left in the figure).

Figure 4:
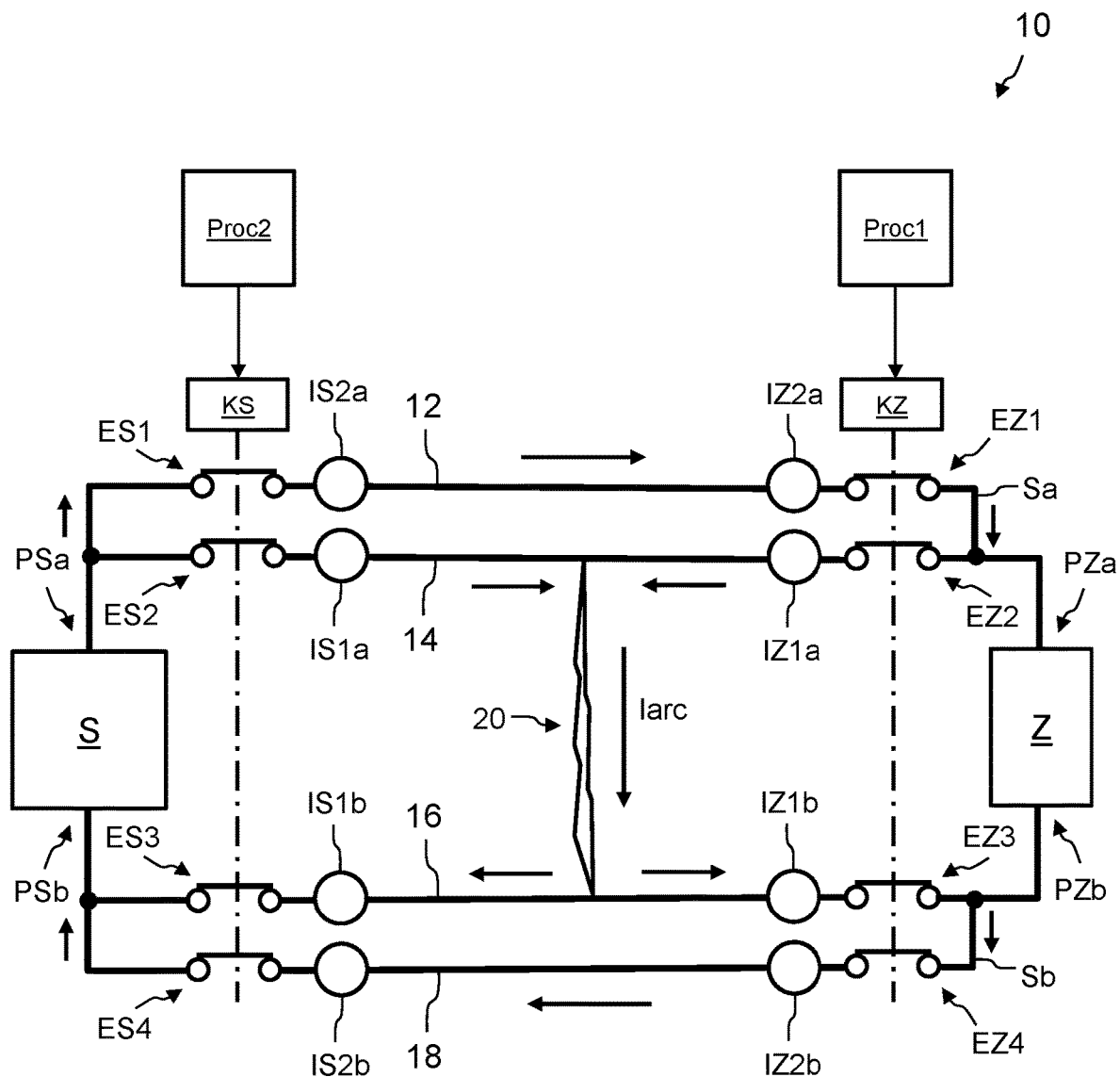
FIG. 4 illustrates the directions in which electric currents flow through the electrical network of FIG. 2, in the presence of a symmetrical electric arc.

When a symmetrical arc 20 occurs, for example between the electrical lines 14 and 16 as illustrated in FIG. 4, because of damage to the electrical lines, an electric current Iarc flows between these two electrical lines 14 and 16. Given that the impedance corresponding to this electric arc 20 is much lower than the impedance corresponding to the electrical load Z, some of the current originating from the electrical line 12 contributes to this current Iarc, via the first stage and second stage EZ1, EZ2 of the second contactor KZ, the link Sa, and also the portion of the electrical line 14 located between its second end and the location of the damage to the electrical line 14 corresponding to the parallel electric arc. Thus, the electric current through the electrical line 12, as measured by the sensor IZ2a, flows in a first direction (illustrated by the arrow from the left to the right in the figure) and the electric current through the portion of the electrical line 14 located between its second end and the location of the damage to the electrical line 14, as measured by the sensor IZ1a, flows in a second direction opposite to the first direction (illustrated by the arrow from the right to the left in the figure). An electric current flowing in the first direction (illustrated by the arrow from the left to the right in the figure) between the first end of the electrical line 14 and the location of the damage to the electrical line 14 also contributes to the current Iarc.

Similarly, some of the current flowing through the electrical line 18 comes from the current Iarc, via the third stage and fourth stage EZ3, EZ4 of the second contactor KZ, the link Sb, and also the portion of the electrical line 16 located between its second end and the location of the damage to the electrical line 16 corresponding to the parallel electric arc 20. Thus, the electric current through the electrical line 18, as measured by the sensor IZ2b, flows in a first direction (illustrated by the arrow from the right to the left in the figure) and the electric current through the portion of the electrical line 16 located between its second end and the location of the damage to the electrical line 16, as measured by the sensor IZ1b, flows in a second direction opposite to the first direction (illustrated by the arrow from the left to the right in the figure). An electric current flowing in the first direction (illustrated by the arrow from the right to the left in the figure) between the first end of the electrical line 16 and the location of the damage to the electrical line 16 also comes from the current Iarc.

Given that the current measurements originating from the two current sensors IZ2a and IZ1a correspond to currents flowing in opposite directions through the two first electrical lines 12 and 14, the processing unit Proc1 controls the second contactor KZ so as to open. Likewise, given that the current measurements originating from the two current sensors IZ2b and IZ1b correspond to currents flowing in opposite directions through the two second electrical lines 16 and 18, the processing unit Proc1 controls the second contactor KZ so as to open.

In one embodiment specific to detecting a symmetrical arc, the processing unit Proc1 is configured so as to control the second contactor KZ so as to open if the current measurements originating from the current sensors IZ2a, IZ1a, on the one hand, and IZ2b, IZ1b, on the other hand, correspond to currents flowing in opposite directions both through the two first electrical lines 12, 14 and through the two second electrical lines 16, 18. This makes it possible to avoid triggering opening of the second contactor KZ in the event of one of the sensors failing, thereby making the electrical network 10 robust against a current sensor failing.

The second contactor KZ opening has the effect of stopping the electric currents from flowing through the first electrical line 12, through the link Sa between the second poles of the first stage and second stage EZ1, EZ2 of the second contactor KZ, and also through the portion of the first electrical line 14 comprised between its second end and the location of the damage to the electrical line 14. The second contactor KZ opening also has the effect of stopping the electric currents from flowing through the second electrical line 18, through the link Sb between the second poles of the third stage and fourth stage EZ3, EZ4 of the second contactor KZ, and also through the portion of the second electrical line 16 comprised between its second end and the location of the damage to the electrical line 16. Consequently, as a result the currents stop contributing to the electric arc current Iarc and therefore the current Iarc decreases substantially.

Figure 5:
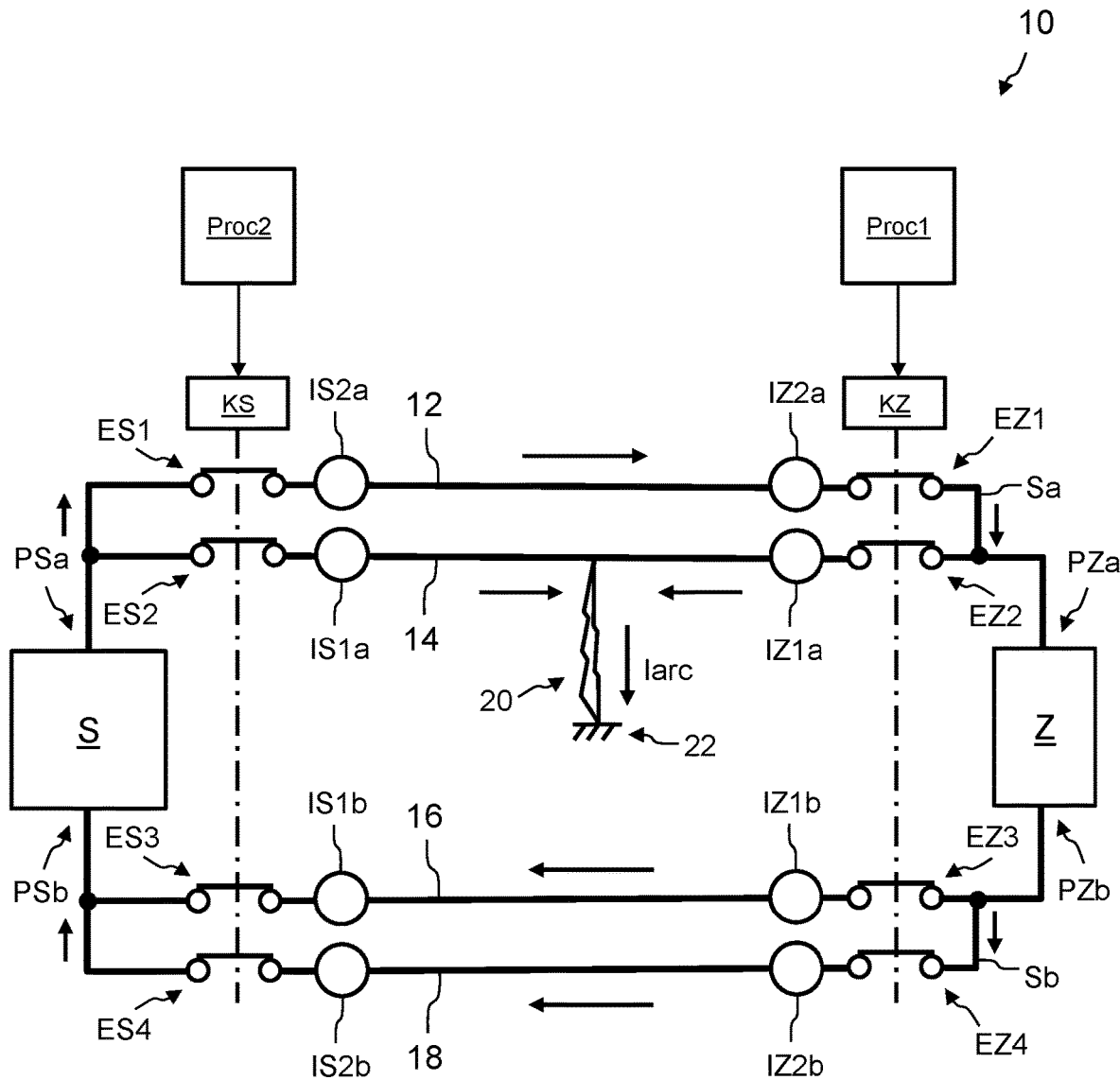
FIG. 5 illustrates the directions in which electric currents flow through the electrical network of FIG. 2, in the presence of an asymmetrical electric arc.

When an asymmetrical arc 20 occurs, for example between the electrical line 14 and a structural element as illustrated in FIG. 5, because of damage to the electrical line 14, an electric current Iarc flows between the electrical line 14 and the structural element. For the reasons already explained in the case of a symmetrical arc, the electric currents through the two first electrical lines 12 and 14, and also through the link Sa, flow in the same directions as in the case of a symmetrical arc. However, the currents through the two second lines 16 and 18, and also through the link Sb, are not disturbed. Thus, as in the case of a symmetrical electric arc, given that the current measurements originating from the two current sensors IZ2a and IZ1a correspond to currents flowing in opposite directions through the two first electrical lines 12 and 14, the processing unit Proc1 controls the second contactor KZ so as to open. The second contactor KZ opening has the effect of stopping the electric currents from flowing through the first electrical line 12, through the link Sa between the second poles of the first stage and second stage EZ1, EZ2 of the second contactor KZ, and also through the portion of the first electrical line 14 comprised between its second end and the location of the damage to the electrical line 14. Consequently, as a result the currents stop contributing to the electric arc current Iarc and therefore the current Iarc decreases substantially.

In one particular embodiment, the electrical network further comprises one current sensor associated with each of the two first electrical lines 12, 14 or with each of the two second electrical lines 16, 18, these current sensors being installed near the first ends of the electrical lines under consideration: two current sensors IS2a, IS1a associated with the two first electrical lines 12, 14, respectively; two current sensors IS1b, IS2b associated with the two second electrical lines 16, 18, respectively. The electrical network 10 further comprises a second processing unit Proc2 linked at input to the current sensors IS2a, IS1a, IS1b, IS2b by means of links LS1 . . . LS4, respectively. The processing unit Proc2 is configured to:
  acquire current measurements originating from the two current sensors IS2a, IS1a or IS1b, IS2b which are associated with each of the two first electrical lines 12, 14 or with each of the two second electrical lines 16, 18;
  calculate a difference between the current measurements originating from the two current sensors IS2a, IS1a or IS1b, IS2b; and
  control the first contactor KS so as to open if this difference is greater than a predetermined value.

Figure 3:
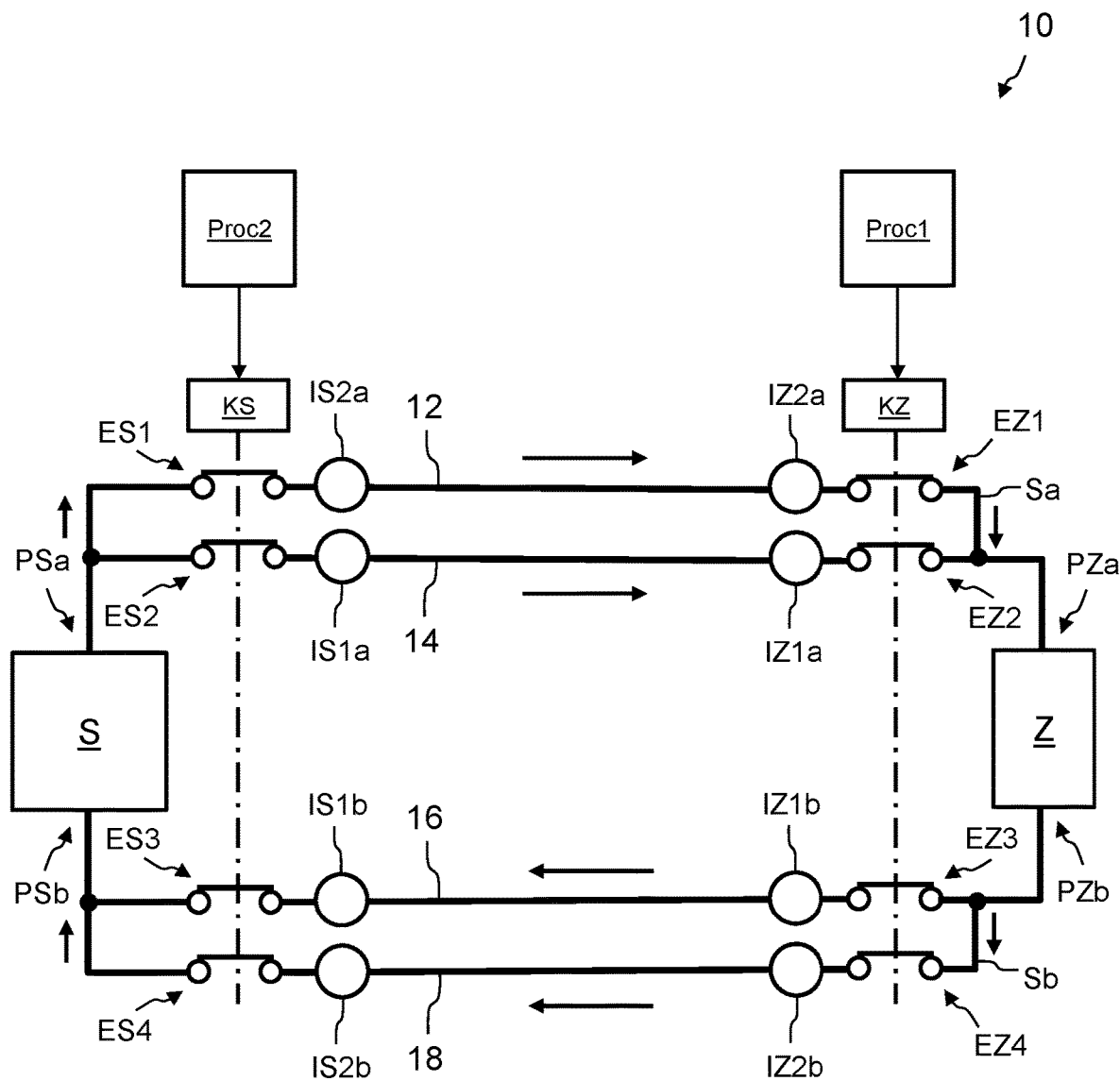
FIG. 3 illustrates the directions in which electric currents flow through the electrical network of FIG. 2, in the absence of an electric arc.

In normal operation, when the electrical load Z is supplied with electric power by the electric power source S as illustrated in FIG. 3, the electric currents through the two first electrical lines 12 and 14 are in the same direction. In so far as the impedances of the two first electrical lines are similar, the currents through the two first electrical lines 12 and 14 are similar Consequently, the difference between the current measurements originating from the two current sensors IS2a and IS1a is substantially zero, and therefore less than the predetermined value.

In the event of a symmetrical electric arc arising as illustrated in FIG. 4 or of an asymmetrical electric arc arising as illustrated in FIG. 5, after the second contactor KZ being controlled so as to open by the first processing unit Proc1, the electric current measured by the current sensor IS2a through the first electrical link 12 is zero. In contrast, a non-zero electric current continues to flow through the electrical link 14, between its first end and the location of the damage corresponding to the electric arc. This electric current is measured by the sensor IS1a. Consequently, the difference between the current measurements originating from the sensors IS1a and IS2a is non-zero and corresponds to the current flowing through the electrical link 14 between its first end and the location of the damage. The predetermined value is chosen to be less than the value of this current. Consequently, the second processing unit Proc2 controls the first contactor KS so as to open. As a result, all current through the electric arc stops and consequently the electrical network and its surroundings are protected.

In the event of a symmetrical electric arc arising, similarly, the current through the second electrical line 18 is zero and a non-zero electric current continues to flow through the electrical link 16, between its first end and the location of the damage corresponding to the electric arc. Consequently, the difference between the current measurements originating from the sensors IS1b and IS2b is non-zero and corresponds to the current flowing through the electrical link 16 between its first end and the location of the damage. The difference is therefore greater than the predetermined value.

In one embodiment specific to detecting a symmetrical arc, the processing unit Proc2 is configured so as to control the first contactor KS so as to open if, on the one hand, the difference between the current measurements originating from the current sensors IS2a and IS1a is greater than the predetermined value and if, on the other hand, the difference between the current measurements originating from the sensors IS2b et IS1b is greater than the predetermined value. This makes it possible to avoid triggering opening of the second contactor KZ in the event of one of the sensors failing, thereby making the electrical network 10 robust against a current sensor failing.

In one embodiment, the second processing unit Proc2 is further configured to:
  determine whether at least one of the current measurements originating from the two current sensors IS2a, IS1a associated with each of the two first electrical lines 12, 14 and of the current measurements originating from the two current sensors IS1b, IS2b associated with each of the two second electrical lines 16, 18 is above a predetermined current threshold; and
  control the first contactor KS so as to open if one of the measurements is above this predetermined current threshold.

The predetermined current threshold is chosen so as to be sufficiently greater than the value of a current flowing through the electrical line under consideration in normal operation (absence of an electric arc) while at the same time making it possible to detect an overcurrent on this electrical line because of a symmetrical or asymmetrical electric arc. Consequently, the second processing unit Proc2 controls the first contactor KS so as to open during an overcurrent through one of the electrical lines 12, 14, 16 or 18 resulting from an electric arc, thereby making it possible to stop this electric arc.

In one embodiment, the second processing unit is further configured to:
  determine whether there is a current differential between the first pole and the second pole of the current source, whether at least one of the current measurements originating from the current sensors IS2a, IS1a associated with one of the two first electrical lines 12, 14 is greater, by at least a predetermined current value, than the current measurements originating from the current sensors IS1b, IS2b associated with the two second electrical lines 16, 18 or whether at least one of the current measurements originating from the current sensors IS1b, IS2b associated with one of the two second electrical lines 16, 18 is greater, by at least the predetermined current value, than the current measurements originating from the current sensors IS2a, IS1a associated with the two first electrical lines 12, 14; and
  control the first contactor KS so as to open if there has been determined to be a current differential.

This makes it possible to detect an asymmetrical arc without waiting for the second contactor KZ to be controlled so as to open by the first processing unit Proc1 and to stop this asymmetrical arc by virtue of the first contactor KS opening. Thus, in the example illustrated in FIG. 5, because of the electric arc 20 arising, at least one of the currents through the electrical lines 12 and 14, as measured by the sensors IS2a and IS1a, respectively, is greater than the currents through the electrical lines 16 and 18, as measured by the sensors IS1b and IS2b, respectively. The predetermined current value is chosen to be sufficiently small to make it possible to detect the current differential during an asymmetrical arc and sufficiently high to avoid detecting current differentials which would not result from such an electric arc.

In one embodiment, the second processing unit Proc2 is further configured to:
  acquire a measurement of a voltage between the first pole PSa and the second pole PSb of the electrical source S; and
  control the first contactor KS so as to open only if the voltage measurement is below a predetermined voltage threshold.

An electric fault arising generally leads to the strength of at least one current through at least one of the first or second electrical lines 12, 14, 16, 18 increasing. Because of the internal resistance of the electrical source S, as a result the voltage between the poles PSa and PSb of the electrical source S decreases. The predetermined voltage threshold is chosen so as to be between, on the one hand, the nominal voltage between the poles PSa and PSb in the absence of an electric arc and, on the other hand, the voltage between these two poles when an electric arc arises. Controlling the first contactor KS so as to open only if the voltage measurement between the poles PSa and PSb is below the predetermined threshold makes it possible to control the first contactor KS so as to open only if an electric arc arising is detected both by at least one current sensor and through the voltage between the poles PSa and PSb decreasing. This avoids the first contactor KS being controlled so as to open, and thus power stopping being supplied to the electrical load Z, in the event of a current sensor failing. As a result, therefore, the robustness of the electrical network 10 is improved.

According to a first alternative, in the various embodiments, the first processing unit Proc1 and the second processing unit Proc2 are independent. This allows complete independence of the protection of the electrical network 10 against electric arcs, on the one hand, on the side of the electrical load Z (by means of the first processing unit Proc1 and of the second contactor KZ) and, on the other hand, on the side of the electric power source S (by means of the second processing unit Proc2 and of the first contactor KS). In one particular example of integration, the first contactor KS, the second processing unit Proc2, and also the sensors IS2a, IS1a, IS1b, IS2b are integrated with one another in the same housing, thus forming an upstream protection device. This upstream protection device is linked, on the one hand, to the two poles PSa and PSb of the electric power source S and, on the other hand, to the two first electrical lines 12, 14 and to the two second electrical lines 16, 18. Likewise, the second contactor KZ, the first processing unit Proc1, and also the sensors IZ2a, IZ1a, IZ1b, IZ2b are integrated with one another in the same housing, thus forming a downstream protection device. This downstream protection device is linked, on the one hand, to the two poles PZa and PZb of the electrical load Z and, on the other hand, to the two first electrical lines 12, 14 and to the two second electrical lines 16, 18.

According to a second alternative, in the various embodiments, the first processing unit Proc1 and the second processing unit Proc2 correspond to one and the same processing unit. This processing unit then provides centralized management of the protection of the electrical network 10 against electric arcs.

In the various aforementioned embodiments, the description relates to a single electrical load Z supplied with power by the electric power source S. This very obviously does not limit the invention, which is also applicable in the case of a plurality of electrical loads which are supplied with power by the same electric power source S. Each electrical load is then linked to the electric power source S in the same way as in the various aforementioned embodiments, that is to say via a first contactor (on the side of the electric power source), two first electrical lines and two second electrical lines, and also a second contactor (on the side of the electrical load).

In addition, the electrical network 10 is intrinsically protected against series electric arcs. Specifically, a series electric arc can occur on an electrical line only if the voltage between two opposite ends of the electrical line is above a predetermined voltage threshold, of around 20 volts. Now, the electrical lines of the electrical network 10 are doubled and linked to one another (via stages of the contactors) at their respective ends: two first electrical lines 12, 14, on the one hand, and two second electrical lines 16, 18, on the other hand Consequently, in the event of damage to one electrical line (for example the line 12), the other, undamaged line (the line 14 in the case of the example) linked to its ends has the effect of short-circuiting the damaged line (the line 12 in the case of the example) and therefore of preventing the voltage between its opposite ends from exceeding the predetermined voltage threshold of around 20 volts. Consequently, a series electric arc cannot appear where the electrical line under consideration is damaged.

Figure 6:
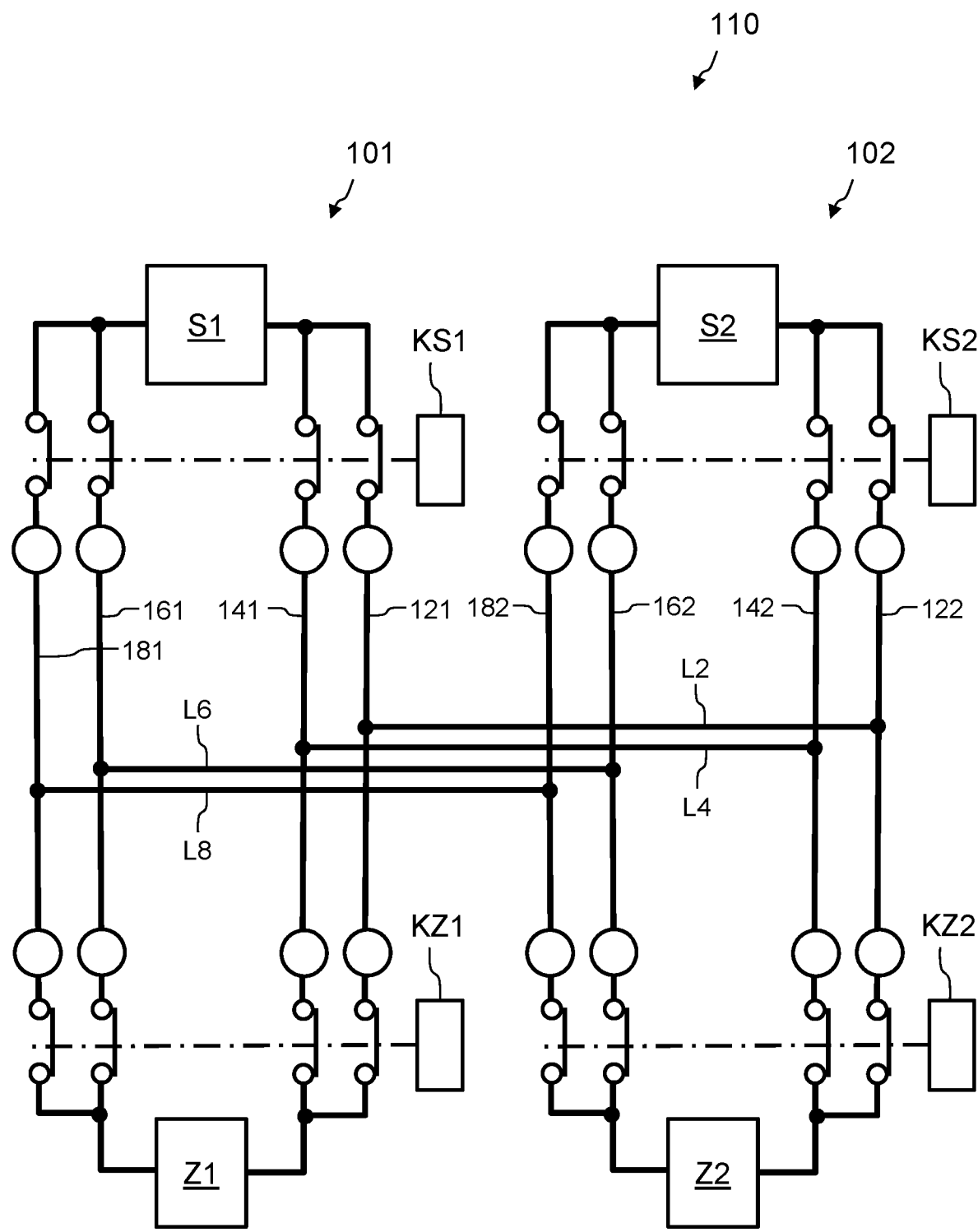
FIG. 6 schematically illustrates a DC electrical network comprising a plurality of subassemblies which are similar to the DC electrical network which is illustrated in FIG. 2.

In one particular embodiment illustrated in FIG. 6, an electrical network 110 comprises at least two subassemblies 101, 102 which are each similar to the previously described electrical network 10. The first subassembly 101 comprises an electric power source S1 linked to an electrical load Z1 by means of two first electrical lines 121, 141 and of two second electrical lines 161, 181. It also comprises a first contactor KS1 and a second contactor KZ1. The second subassembly 102 comprises an electric power source S2 linked to an electrical load Z2 by means of two first electrical lines 122, 142 and of two second electrical lines 162, 182. It also comprises a first contactor KS2 and a second contactor KZ2. In order to keep the figure legible, the processing units which control the various contactors are not shown.

The two first electrical lines 121, 141 of the first subassembly 101 are linked one by one to the two first electrical lines 122, 142 of the second subassembly 102 by means of respective links L2, L4 and the two second electrical lines 161, 181 of the first subassembly 101 are linked one by one to the two second electrical lines 162, 182 of the second subassembly 102 by means of respective links L6, L8. This makes it possible to pool the two electric power sources S1, S2 to supply electric power to the loads Z1 and Z2. Preferably, one of the electric power sources is current-controlled and the other is voltage-controlled, so as to make it possible for them to be interconnected.

The operation of the protection against electric arcs is similar to that described previously in the case of the electrical network 10. Specifically, the detection of electric arcs and also the protection of the electrical network by opening of the appropriate contactors are implemented locally near the electrical loads Z1, Z2 or the electric power sources S1, S2, which makes this detection and this protection independent of the overall topology of the electrical network, whether or not there are interconnections between the various electrical lines.

When the electrical network 110 is an electrical network installed on board an aircraft, the electric power sources S1 and S2 are, for example, each linked to distinct electric generators. These electric generators are, for example, driven by engines of the aircraft.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A DC electrical network configured to supply electricity to an electrical load by means of an electric power source, the electrical network comprising:
    said electric power source, comprising a first pole and a second pole; and
    said electrical load, comprising a first pole and a second pole;
    wherein the first pole of the electric power source is linked to a first end of a first one of two first electrical lines, via a first stage of a first contactor;
    wherein the first pole of the electric power source is linked to a first end of a second one of the two first electrical lines, via a second stage of the first contactor;
    wherein a second end of the first one of the two first electrical lines is linked to a first pole of a first stage of a second contactor and wherein a second end of the second one of the two first electrical lines is linked to a first pole of a second stage of the second contactor;
    wherein the first stage of the first contactor and the first stage of the second contactor are placed in series in the first one of the two first electrical lines;
    wherein the second stage of the first contactor and the second stage of the second contactor are placed in series in the second one of the two first electrical lines;
    wherein second poles of the first stage and of the second stage of the second contactor are linked to one another, and also to the first pole of the electrical load;
    wherein the second pole of the electric power source is linked to a first end of a first one of two second electrical lines, via a third stage of the first contactor;
    wherein the second pole of the electric power source is linked to a first end of a second one of the two second electrical lines, via a fourth stage of the first contactor;
    wherein a second end of the first one of the two second electrical lines is linked to a first pole of a third stage of the second contactor and wherein a second end of the second one of the two second electric lines is linked to a first pole of a fourth stage of the second contactor;
    wherein the third stage of the first contactor and the third stage of the second contactor are placed in series in the first one of the two second electrical lines;
    wherein the fourth stage of the first contactor and the fourth stage of the second contactor are placed in series in the second one of the two second electrical lines;
    wherein second poles of the third stage and of the fourth stage of the second contactor are linked to one another, and also to the second pole of the electrical load;
    wherein there are two current sensors associated with the two first electrical lines, one of the current sensors being associated with the first one of the two first electrical lines, and the other one of the current sensors being associated with the second one of the two first electrical lines;
    wherein there are two current sensors associated with the two second electrical lines, one of the current sensors being associated with the first one of the two second electrical lines, and the other one of the current sensors being associated with the second one of the two second electrical lines;
    wherein the electrical network further comprises a first processing unit configured to:
        acquire current measurements originating from the two current sensors associated with each of the two first electrical lines or with each of the two second electrical lines;
        determine whether the current measurements originating from said two current sensors correspond to currents flowing in opposite directions through the two first electrical lines or through the two second electrical lines which occurs when one of the two first electrical lines or one of the two second electrical lines is damaged; and
        control the second contactor to open when the current measurements originating from the two sensors correspond to currents flowing in opposite directions through the two first electrical lines or through the two second electrical lines, wherein the second contactor remains closed in the absence of an electrical arc.

2. The electrical network according to claim 1, wherein said two current sensors correspond to second current sensors installed near the second ends of the two first electrical lines or the two second electrical lines.

3. The electrical network according to claim 2, wherein one second current sensor is associated with each of the two first electrical lines and also with each of the two second electrical lines and the first processing unit is configured to:
acquire current measurements originating from the two second current sensors associated with each of the two first electrical lines and also current measurements originating from the two second current sensors associated with each of the two second electrical lines;
determine whether the current measurements originating from the second current sensors correspond to currents flowing in opposite directions through the two first electrical lines and also through the two second electrical lines; and
control the second contactor to open if the current measurements originating from the second current sensors correspond to currents flowing in opposite directions both through the two first electrical lines and through the two second electrical lines.

4. The electrical network according to claim 2, wherein one first current sensor is associated with each of the two first electrical lines or with each of the two second electrical lines, the first current sensors being installed near the first ends of the two first electrical lines or the two second electrical lines, and
wherein the electrical network further comprises a second processing unit configured to:
acquire current measurements originating from the two first current sensors associated with each of the two first electrical lines or with each of the two second electrical lines;
calculate a difference between the current measurements originating from said two first current sensors; and
control the first contactor to open if this difference is greater than a predetermined value.

5. The electrical network according to claim 4, wherein one first current sensor is associated with each of the two first electrical lines and also with each of the two second electrical lines and the second processing unit is configured to:
acquire current measurements originating from the two first current sensors associated with each of the two first electrical lines and also current measurements originating from the two first current sensors associated with each of the two second electrical lines;
calculate a first difference between the current measurements originating from the two first current sensors associated with each of the two first electrical lines and calculate a second difference between the current measurements originating from the two first current sensors associated with each of the two second electrical lines; and
control the first contactor to open if the first difference and the second difference are both greater than a predetermined value.

6. The electrical network according to claim 4, wherein the second processing unit is further configured to:
determine whether at least one of the current measurements originating from the two first current sensors associated with each of the two first electrical lines and of the current measurements originating from the two first current sensors associated with each of the two second electrical lines is above a predetermined current threshold; and
control the first contactor to open if one of said measurements is above this predetermined current threshold.

7. The electrical network according to claim 4, wherein the second processing unit is further configured to:
determine whether there is a current differential between the first pole and the second pole of the current source, whether at least one of the current measurements originating from the first current sensors associated with one of the two first electrical lines is greater, by at least a predetermined current value, than the current measurements originating from the first current sensors associated with the two second electrical lines or whether at least one of the current measurements originating from the first current sensors associated with one of the two second electrical lines is greater, by at least said predetermined current value, than the current measurements originating from the first current sensors associated with the two first electrical lines; and
control the first contactor to open if there has been determined to be a current differential.

8. The electrical network according to claim 4, wherein the second processing unit is further configured to:
acquire a measurement of a voltage between the first pole and the second pole of the electrical source; and
control the first contactor to open only if said voltage measurement is below a predetermined voltage threshold.

9. The electrical network comprising at least one first subassembly and one second subassembly each corresponding to an electrical network according to claim 1, wherein the two first electrical lines of the first subassembly are linked one by one to the two first electrical lines of the second subassembly and the two second electrical lines of the first subassembly are linked one by one to the two second electrical lines of the second subassembly.

10. An aircraft, comprising an electrical network according to claim 1.

* * * * *